(12) United States Patent
Lo

(10) Patent No.: US 6,813,155 B2
(45) Date of Patent: Nov. 2, 2004

(54) HEAT SINK CLIP WITH INTERCHANGEABLE OPERATING BODY

(75) Inventor: Wei-Ta Lo, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/365,272

(22) Filed: Feb. 11, 2003

(65) Prior Publication Data

US 2004/0062008 A1 Apr. 1, 2004

(30) Foreign Application Priority Data

Sep. 30, 2002 (TW) ...................................... 91215449 U

(51) Int. Cl.⁷ ................................................ H05K 7/20
(52) U.S. Cl. ...................... 361/709; 361/715; 165/80.3; 248/510; 257/719
(58) Field of Search ................................ 361/687–720; 257/718–727; 24/453, 457, 458, 625; 248/505, 510; 165/80.3, 185; 174/16.3

(56) References Cited

U.S. PATENT DOCUMENTS 5,443,591 A * 8/1995 Tsai ........................... 439/342
5,477,916 A * 12/1995 Lin ............................ 165/80.3
6,118,659 A * 9/2000 Adams et al. ............... 361/704
6,421,242 B1 * 7/2002 Chen .......................... 361/704
6,532,153 B1 * 3/2003 Chiu .......................... 361/703

* cited by examiner

Primary Examiner—Darren Schuberg
Assistant Examiner—Anthony Q. Edwards
(74) Attorney, Agent, or Firm—Wei Te Chung

(57) ABSTRACT

A heat sink clip includes a main body (20), and an operating body (40) rotatably attached to the main body. The main body includes a central portion (21), and two clipping portions (23) depending from opposite ends thereof. Two mounting portions (27) depend from the main body. A claw (25) is formed on each mounting portion. The operating body includes a shaft (41) rotatably received in the claws of the main body, and a handle (43) perpendicularly extending from one end of the shaft. A cam (45) is formed on the shaft. Two annular recesses (47) are defined in the shaft at opposite sides of the cam, the recesses rotatably receiving the claws. If the operating body needs to be replaced with another operating body having a different sized cam, the operating body is easily pulled out from the claws.

18 Claims, 6 Drawing Sheets

HEAT SINK CLIP WITH INTERCHANGEABLE OPERATING BODY

BACKGROUND OF THE INVENTION

1. Field of the Invention

The present invention relates to heat sink clips, and more particularly to a heat sink clip which easily and securely attaches a heat sink on a heat generating package without the need for a tool.

2. Description of Prior Art

A computer central processing unit (CPU) is the core administrator of electrical signals for most contemporary personal computers. Continued development of CPUs has enabled them to perform more and more functions. Heat generated by CPUs has increased commensurately. Excessive heat can adversely affect the operational stability of the computer. Measures must be taken to efficiently remove the heat from the CPU. Typically, a heat sink having great heat conductivity is mounted on the CPU to remove heat therefrom. A clip is frequently used to firmly attach the heat sink to the CPU, thus achieving greater efficiency of heat transfer.

FIG. 5 illustrates a conventional clip for fastening a heat sink to a CPU, as disclosed in Taiwan Patent No. 270560. The clip is formed from a plate of resilient material, and is generally M-shaped. The clip includes a pressing portion 10, two elastic portions 12 extending from opposite ends of the pressing portion 10, and two clip arms 14 depending from distal ends of the elastic portions 12. Each arm 14 defines two slots 16, one above the other. The lower slots 16 of the arms 14 engagingly receive ears 19 of a socket on which the CPU is mounted. The clip thereby resiliently attaches the heat sink to an upper surface of the CPU. A handle 18 is formed at the higher slot 16 of each arm 14, for facilitating operation of the clip by hand or with a tool. However, if the handle 18 is operated by hand, it is inconvenient and uncomfortable, and may even hurt the operator's hand. If the handle 18 is operated with a tool such as a screwdriver, the screwdriver is prone to slip and damage other nearby components on a motherboard on which the socket is mounted.

FIG. 6 illustrates another kind of clip for fastening a heat sink to a CPU, as disclosed in U.S. Pat. No. 6,061,239. Each of a pair of clips has a main body 10'. A pair of hooks 12' extends from opposite ends of the main body 10', for engaging in a chassis of a heat sink. An operating body 14' above the main body 10' is pivotally attached to the main body 10'. The operating body 14' has a cam 16' for pressing the heat sink onto a heat generating electronic package. The clip is convenient and safe to operate, and does not need a tool. However the operating body 14' is effectively permanently mounted on the main body 10'. If another heat sink having a different size is used, the cams 16' of the clips are unlikely to be able to fit properly and press the new heat sink. Usually, another pair of differently sized clips needs to be obtained. This is inconvenient and costly.

SUMMARY OF THE INVENTION

Accordingly, an object of the present invention is to provide a heat sink clip which easily and securely and mounts a heat sink on a CPU.

Another object of the present invention is to provide a heat sink clip which can be used for any of a variety of differently sized heat sinks.

In order to achieve the objects set out above, a heat sink clip in accordance with the present invention includes a main body, and an operating body rotatably attached to the main body. The main body comprises a central portion, and a pair of clipping portions depending from opposite ends of the central portion respectively. A concavity is defined in a side of the main body near one of the clipping portions. A pair of mounting portions depends from a middle of the main body. A claw is formed at an end of each mounting portion. The operating body comprises a shaft rotatably received in the claws of the main body, and a handle perpendicularly extending from one end of the shaft and receivable in the concavity. A cam is formed on a center of the shaft. A pair of annular recesses is defined in the shaft at opposite sides of the cam respectively, the recesses rotatably receiving the claws of the main body. When the handle is rotated, the cam is driven to press on a heat sink. The heat sink clip thus resiliently and firmly attaches the heat sink onto an electronic package. If the operating body needs to be replaced with another operating body having a different sized cam, the operating body is easily pulled out from the claws.

Other objects, advantages and novel features of the present invention will become more apparent from the following detailed description when taken in conjunction with the accompanying drawings, in which:

DETAILED DESCRIPTION OF THE INVENTION

Reference will now be made to the drawings to describe preferred embodiments of the present invention in detail.

Figure 1:
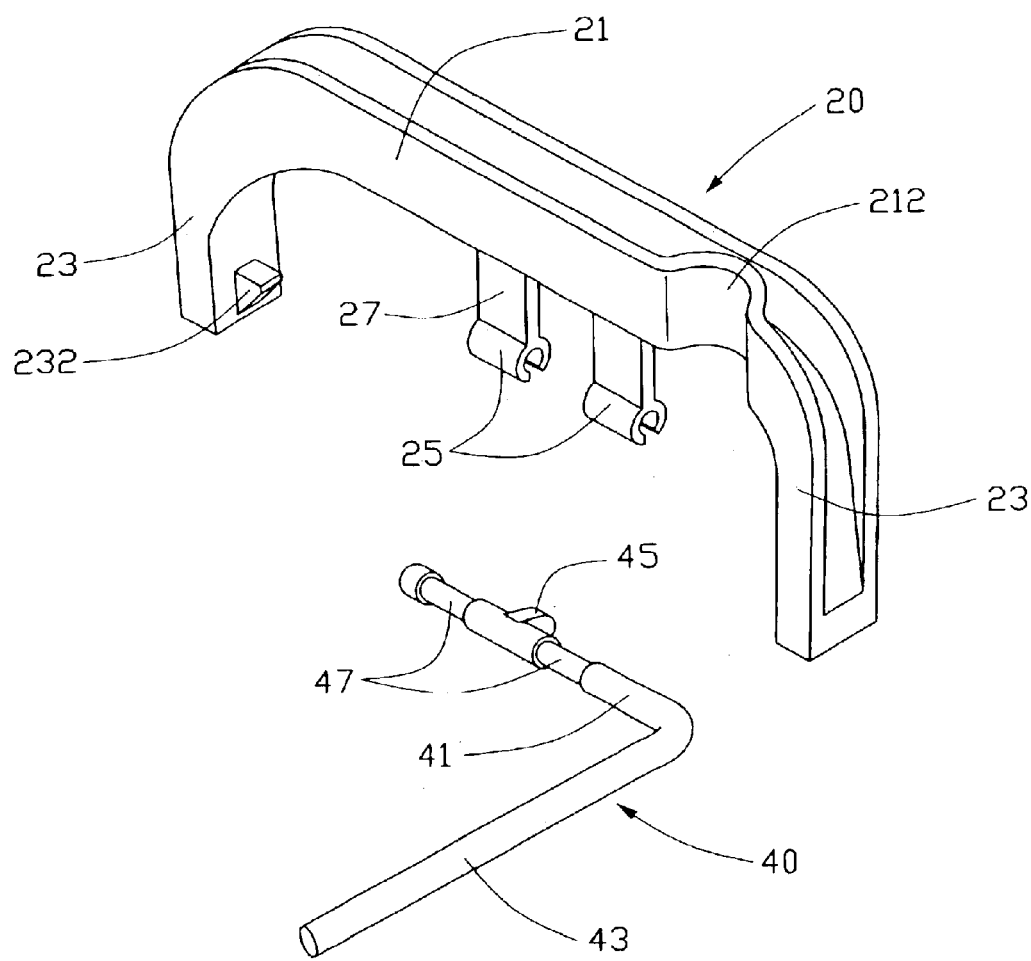
FIG. 1 is an exploded, isometric view of a heat sink clip in accordance with a preferred embodiment of the present invention.

Referring to FIG. 1, a heat sink clip in accordance with a preferred embodiment of the present invention includes a main body 20, and an operating body 40 rotatably attached to the main body 20. The main body 20 comprises a central portion 21, and a pair of clipping portions 23 depending from opposite ends of the central portion 21 respectively. A hook 232 is inwardly formed at end of each clipping portion 23. A concavity 212 is defined in a side of the main body 20 near one of the clipping portions 23. A pair of mounting portions 27 depends from a middle of the main body 20. A claw 25 is formed at an end of each mounting portion 27. The claw 25 has a generally C-shaped profile, and an opening (not labeled) at a distal end thereof.

The operating body 40 comprises a shaft 41 which can pivot in the claws 25 of the main body 20, and a handle 43 perpendicularly extending from one end of the shaft 41. A cam 45 is formed on a center of the shaft 41. A pair of annular recesses 47 is defined in the shaft 41 at opposite sides of the cam 45 respectively, for rotatably receiving the claws 25 of the main body 20.

In assembly, the shaft 41 is snappingly mounted in the claws 25 of the main body 20. The recesses 47 fittingly and rotatably receive the claws 25. The shaft 41 is prevented from moving in directions defined by a rotational axis thereof. If the operating body 40 needs to be replaced with another operating body 40 having a different sized cam 45, the operating body 40 is easily pulled out from the claws 25. Thus it is convenient to adapt the heat sink clip so that it can be used with any of a variety of heat sinks having different configurations.

Figure 2:
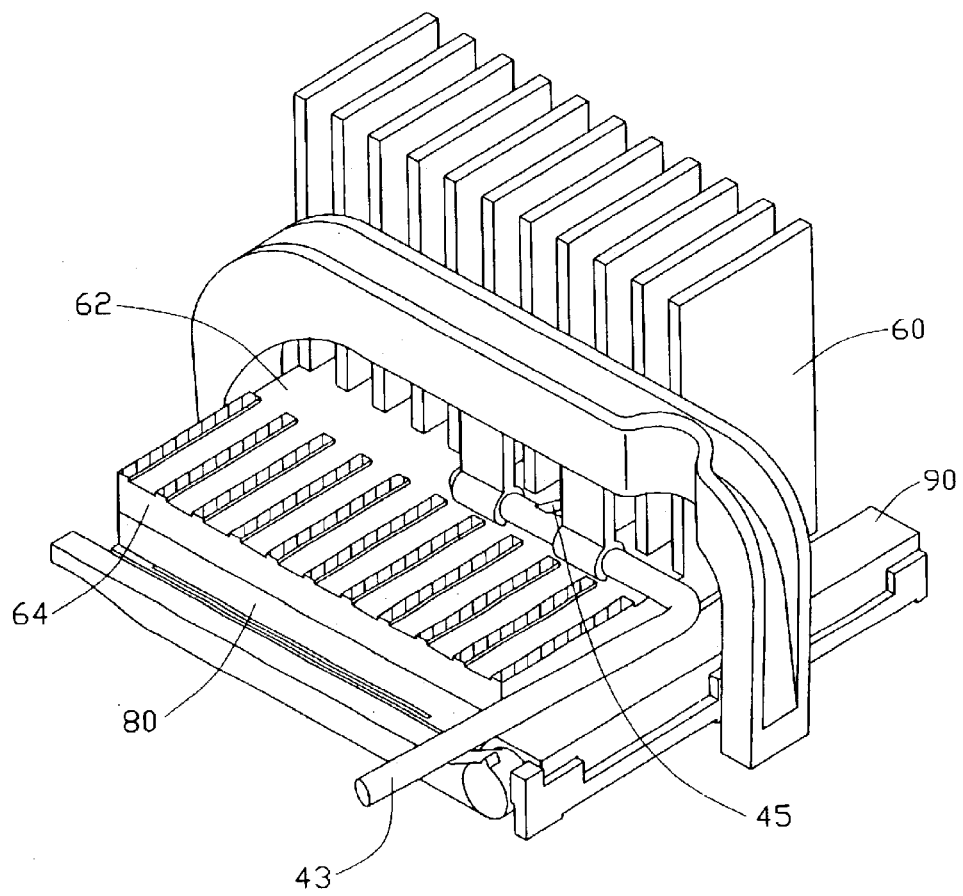
FIG. 2 is an isometric view of the clip of FIG. 1 loosely attaching a heat sink to an electronic package that is mounted on a socket connector, with part of the heat sink cut away for better illustration.
Figure 3:
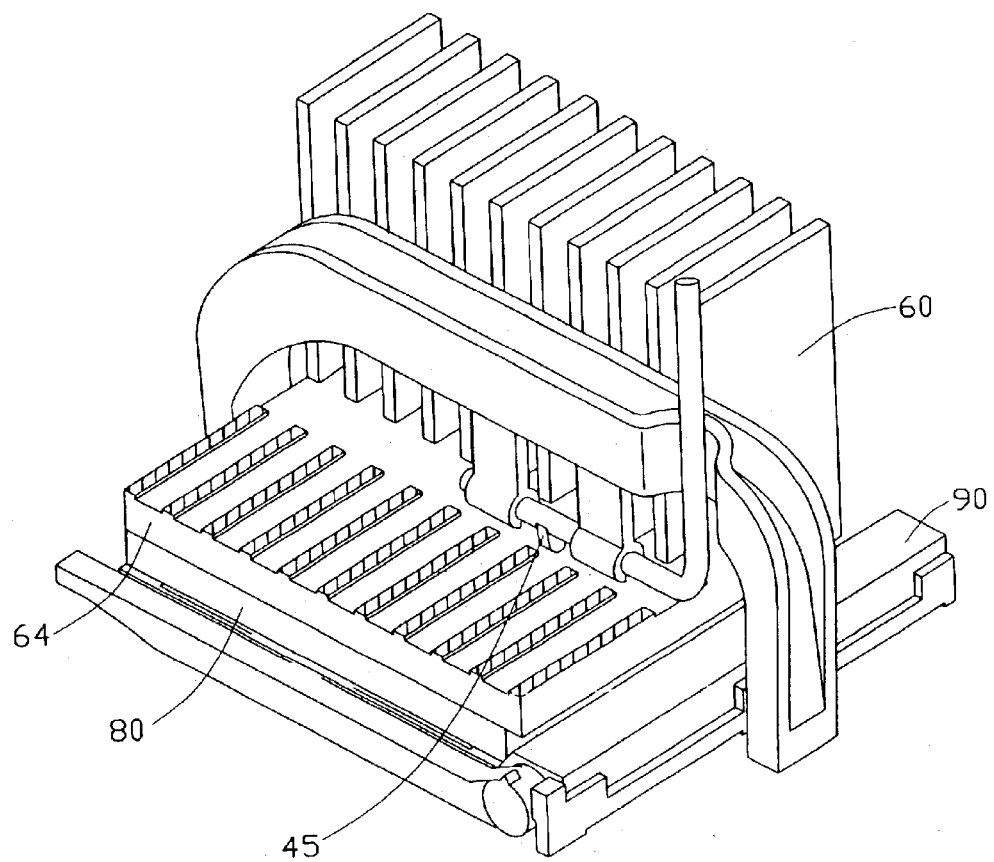
FIG. 3 is similar to FIG. 2, but showing the clip resiliently and firmly attaching the heat sink to the electronic package.

Referring to FIGS. 2 and 3, the heat sink clip of the present invention cooperates with a heat sink 60, an electronic package 80 and a socket connector 90 that supports and surrounds the electronic package 80 to cooperatively form a heat dissipating assembly. In assembly, the handle 43 of the operating body 40 of the clip is rotated to a horizontal position. The heat sink clip is placed in a ditch 62 of the heat sink 60. The hooks 232 of the heat sink clip snappingly engage in clipping holes (not shown) of the connector 90. The handle 43 is rotated up to a vertical position, so that it is received in the concavity 212 of the main body 20. Thus the cam 45 of the operating body 40 resiliently presses a chassis 64 of the heat sink 60, causing the hooks 232 to be firmly engaged in the clipping holes (not shown). The heat sink 60 is securely mounted on the electronic package 80.

In disassembly, the operating body 40 is rotated from the vertical position to the horizontal position, so that the cam 45 is released from engagement with the chassis 64 of the heat sink 60. The hooks 232 are removed from the clipping holes (not shown). The heat sink clip and the heat sink 60 are easily taken off from the electronic package 80.

Figure 4:
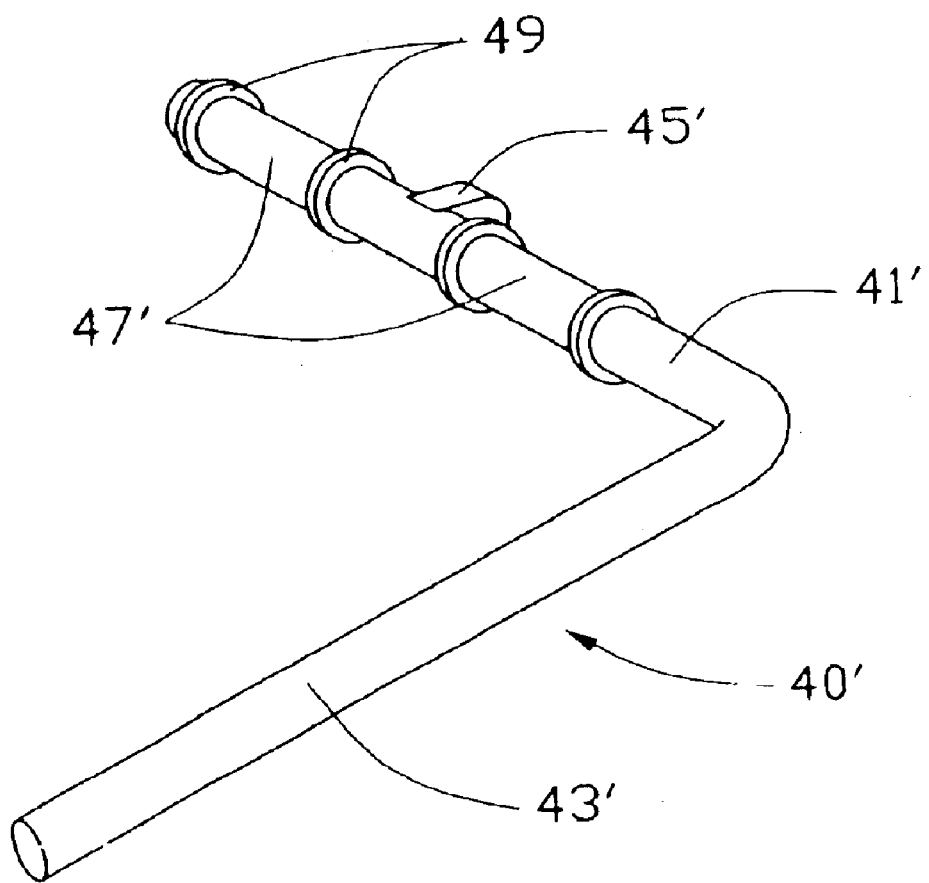
FIG. 4 is an isometric view of an operating body of a heat sink clip in accordance with an alternative embodiment of the present invention.
Figure 5:
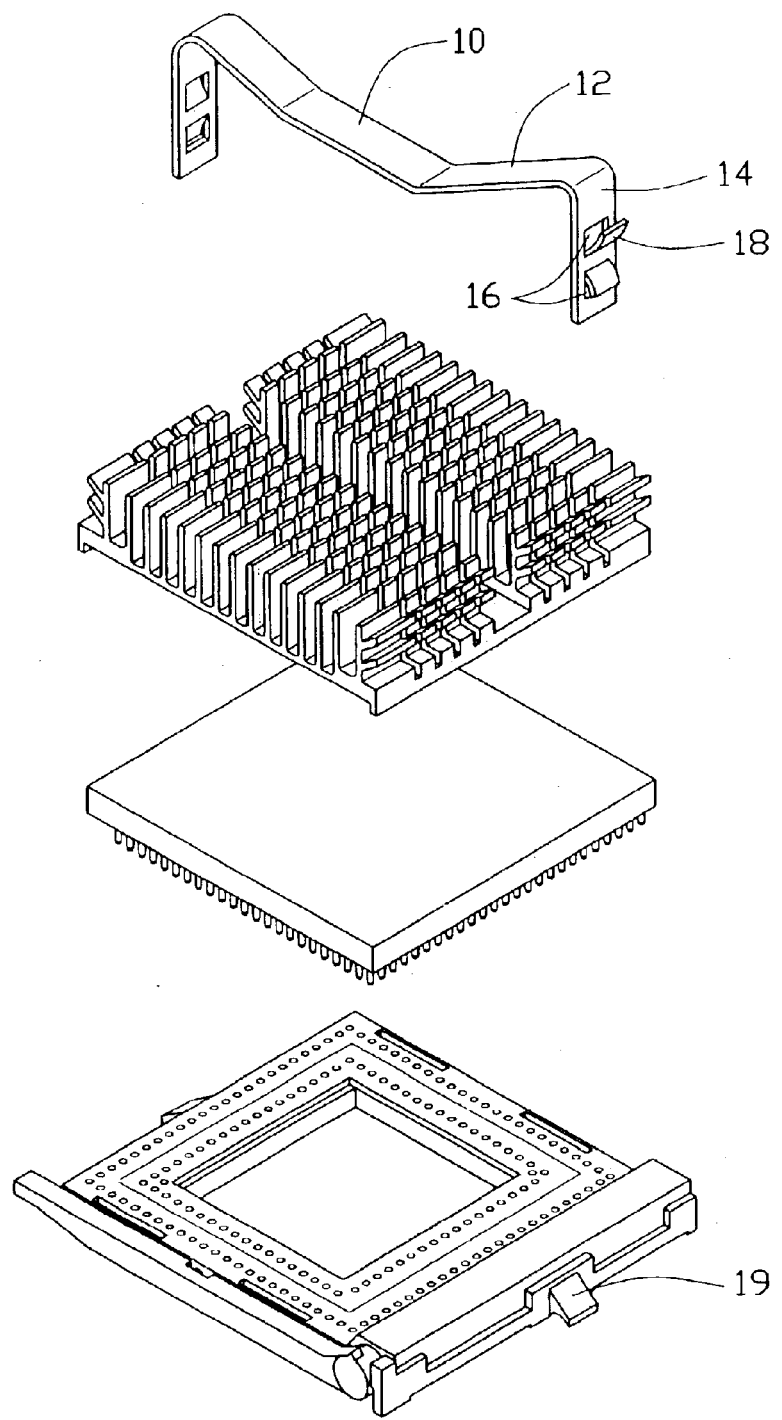
FIG. 5 is an exploded, isometric view of a conventional heat sink clip and associated heat dissipating assembly.
Figure 6:
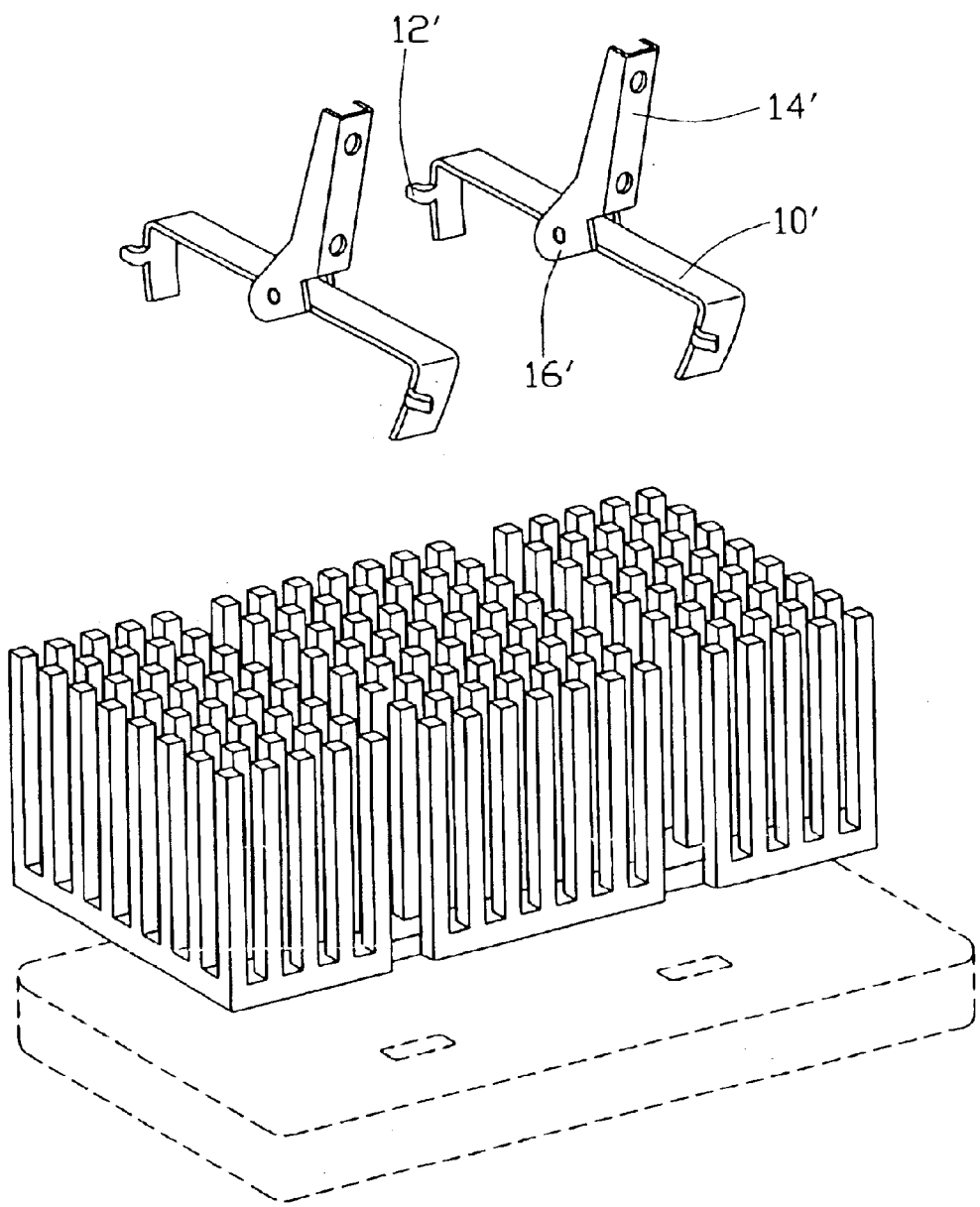
FIG. 6 is an exploded, isometric view of another conventional heat sink clip and associated heat dissipating assembly.

FIG. 4 shows an operating body 40' of a heat sink clip in accordance with an alternative embodiment of the operating body of the present invention. The operating body 40' includes a shaft 41', and a handle 43' extending perpendicularly from one end of the shaft 41'. A cam 45' is formed on a center of the shaft 41'. A pair of annular protrusions 49 is formed on the shaft 41' at each of opposite sides of the cam 45'. A recess 47' is defined between each pair of protrusions 49. The recesses 47' fittingly and rotatably receive the claws 25 of the main body 20. The shaft 41' is prevented from moving in directions defined by a rotational axis thereof. The operating body 40' is thus movably mounted to the main body 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. For example, some alternations may have the heat sink equipped with the corresponding fan as one piece for being commonly attached to the connector, or have the clip attached to the retention module surrounding the CPU socket instead of the CPU socket under the CPU.

What is claimed is:

1. A heat sink clip adapted to mount a heat sink to a heat generating package, the heat sink clip comprising;

a main body comprising a central portion, a pair of clipping portions depending downwardly from opposite ends of the central portion respectively, and a mounting portion arranged below the central portion and between the clipping portions; and an operating body comprising a shaft and a handle extending from one end of the shaft, a cam being formed on the shaft, the shaft being rotatably received in the mounting portion, wherein the shaft and the handle cooperatively form an L profile, and a recess is defined in an outer circumferential surface of the shaft at a side of the cam.

2. The heat sink clip recited in claim 1, wherein a hook is formed at an end of each of the clipping portions.

3. The heat sink clip recited in claim 1, wherein a diameter of the shaft at the recess is less than a diameter of remaining portions of the shaft.

4. The heat sink clip recited in claim 3, wherein the mounting portion comprises a generally C-shaped claw formed at an end thereof, the claw rotatably receiving the shaft of the operating body at the recess.

5. The heat sink clip recited in claim 1, wherein a pair of protrusions is formed on the shaft.

6. The heat sink clip recited in claim 5, wherein a diameter of each of the protrusions is greater than a diameter of remaining portions of the shaft.

7. The heat sink clip recited in claim 6, wherein the mounting portion comprises a generally C-shaped claw formed at an end thereof, the claw rotatably receiving the shaft of the operating body between the protrusions.

8. The heat sink clip recited in claim 1, wherein the central portion defines a longitudinal direction which is substantially parallel to a rotational axis of the operating body.

9. A heat dissipating assembly comprising:

a heat sink comprising a plurality of fins and defining a channel between the fins; and a heat generating package under the heat sink;

a connector supporting the heat generating package thereon; and a clip attaching the heat sink on the heat generating package, the clip comprising:

a main body comprising a central portion received in the channel of the heat sink, a pair of clipping portions depending downwardly from opposite ends of the central portion, and a mounting portion extending below the central portion, and an operating body comprising a shaft with a cam, and a handle extending from one end of the shaft, wherein the shaft and the handle cooperatively form an L profile;

wherein the shaft is rotatably received in the mounting portion and located between the central portion of the main body and the heat sink, the clipping portions are engaged with the connector, and the handle is rotatable to cause the cam urging the heat sink toward the heat generating package.

10. The heat dissipating assembly recited in claim 9, wherein a C-shaped claw is formed at an end of the mounting portion, the claw rotatably receiving the shaft of the operating body therein.

11. The heat dissipating assembly recited in claim 10, wherein a recess is defined in the shaft, a diameter of the shaft at the recess is less than a diameter of remaining portions of the shaft, and the claw rotatably receives the shaft at the recess for preventing the shaft from moving in axial directions.

12. The heat dissipating assembly recited in claim 10, wherein a pair of protrusions is formed on the shaft, a diameter of each of the protrusions is greater than a diameter of remaining portions of the shaft, and the claw rotatably receives the shaft between the protrusions for preventing the shaft from moving in axial directions.

13. The heat dissipating assembly recited in claim 9, wherein a concavity is defined in one side of the central portion for receiving the handle of the operating body therein.

14. A heat dissipation combination comprising:

a heat generating package assembly defining at least one latching section;

a heat sink assembly seated upon said heat generating package assembly; and a clip attaching the heat sink assembly to the heat generating package assembly, said clip including:

a main body having at least one lacking section interlocked with said latching section, and an operation body detachably attached to the main body and moveable relative to the main body between opposite first and second positions; wherein said operation body defines a cam with a specific configuration so as to impose a force upon the heat sink assembly when said operation body is moved to said first position for resulting in a tension status of the clip, and release said force from the heat sink assembly when said operation body is moved to said second position for resulting in a relaxed status of the clip, whereby the clip can be applied to different dimensioned heat sink assemblies by only changing with different configured cams while maintaining the same main body thereof; wherein intergaging devices are formed on both said operation body and said main body, respectively, to result in said operation body being easily detachably attached to said main body in a lateral direction perpendicular to an axis about which said operation body is rotatable relative to the main body for activation said cam.

15. The assembly recited in claim 14, wherein said main body includes a central portion along a longitudinal direction thereof, and a rotation axis of said operation body extends along said longitudinal direction.

16. The assembly recited in claim 15, further including means for restricting said operation body from moving relative to the main body along said longitudinal direction.

17. The assembly recited in claim 14, wherein said heat generating package assembly includes an electronic package and a connector on which said electronic package is mounted.

18. The assembly recited in claim 17, wherein said latching section is located on said connector.

* * * * *